United States Patent [19]

Ikeya et al.

[11] Patent Number: 4,617,584

[45] Date of Patent: Oct. 14, 1986

[54] RESIN ENCAPSULATION TYPE SEMICONDUCTOR DEVICE

[75] Inventors: Hirotoshi Ikeya, Yokosuka; Akiko Hatanaka, Sendai, both of Japan

[73] Assignee: Tokyo Shibaura Denki Kabushiki Kaisha, Kawasaki, Japan

[21] Appl. No.: 479,481

[22] Filed: Mar. 28, 1983

[51] Int. Cl.$^4$ .............................................. H01L 23/30
[52] U.S. Cl. ........................................ 357/72; 428/76; 525/485
[58] Field of Search ................. 525/485, 481; 428/76; 357/72

[56] References Cited

U.S. PATENT DOCUMENTS 3,998,789 12/1976 Yoshioka ............................ 525/485
4,328,150 5/1982 Kondow et al. .................... 523/400

FOREIGN PATENT DOCUMENTS 0041662 12/1981 European Pat. Off. .

OTHER PUBLICATIONS

Lee et al, "Non-Carboxylic Acid Curing Agents", Handbook of Epoxy Resins, 1967, Chapter 11, pp. 16-17.
Patents Abstracts of Japan, vol. 7, No. 8 (E-152) (1153), Jan. 13, 1983.

Primary Examiner—Alexander S. Thomas
Attorney, Agent, or Firm—Schwartz, Jeffery, Schwaab, Mack, Blumenthal & Evans

[57] ABSTRACT

There is disclosed a highly reliable resin encapsulation type semiconductor device excellent humidity resistance as well as high temperature electric characteristics. The specific feature consists in the epoxy resin composition employed for encapsulation. This composition comprises a novolac type epoxy resin, a novolac type phenol resin, an organic phosphine compound and an organic phosphorus acid compound.

The resin encapsulation type semiconductor device is markedly small in leak current under hot an humid conditions and has a prolonged life due to difficult deterioration through corrosion of electrodes and aluminum wiring, as compared with those of prior art.

13 Claims, No Drawings

RESIN ENCAPSULATION TYPE SEMICONDUCTOR DEVICE

This invention relates to a resin encapsulation type semiconductor device, more particularly to a resin encapsulation type semiconductor device excellent in humidity resistance and high temperature electrical characteristics.

Resin encapsulation type semiconductor devices comprise semiconductor elements such as integrated circuits (IC), large scale integrated circuits (LSI), transistors, diodes, and the like, encapsulated with the use of thermosetting resins in order to protect such elements from outer atmospheres or mechanical shocks.

As techniques for encapsulation of semiconductor elements, there have been formerly employed hermetic encapsulation by use of metals or ceramics, but in recent years resin encapsulation has become the mainstream technique for the reason of economical advantage.

As such a resin for encapsulation of semiconductors, there have generally widely been employed epoxy resin compositions for low pressure molding which can be used for low pressure transfer molding suitable for mass production. However, resin encapsulation type semiconductor devices of the prior art obtained by, for example, transfer molding of an epoxy resin composition comprising an epoxy resin, a novolac type phenol resin curing agent and an imidazole curing accelerator (see, for example, U.S. Pat. No. 3,493,630) or tetraphenylphosphonium tetraphenylborate curing accelerator (see, for example, Chemical Abstracts Nos. 11754P, Vol. 83, 1975 and 11505d, Vol 84, 1976) involves the following drawbacks, namely:

(1) Due to inferior humidity resistance, aluminum electrodes or others suffer from corrosive deterioration; and (2) Due to inferior electrical characteristics at higher temperatures, particularly increase of leak current, functions of semiconductor elements are lowered.

Among them, to explain about the drawback (1), resin encapsulation type semiconductor devices may be sometimes used or stored under atmospheres of high temperature and high humidity, and therefore reliability must be ensured even under such conditions. As a reliability evaluation test for quality warranty of humidity resistance, there has been conducted the acceleration evaluation method in which articles are exposed to a saturated steam at 85° C. or 120° C. More recently, is also practiced the evaluation test of the bias application type in which acceleration is further enhanced by application of a voltage.

However, in resin encapsulation type semiconductor devices employing epoxy resin compositions, the encapsulation resin has hygroscopicity, and hence moisture will permeate from an outer atmosphere through the encapsulation resin layer or through the interface between the encapsulation resin and the lead frame into the inner portion until it reaches the surface of the semiconductor element. As the result of the interaction between the moisture and impurities existing within the encapsulation resin, resin encapsulation type semiconductor devices may generate failures due to corrosion of aluminum electrodes, wiring and others. When a bias voltage is applied, there will especially markedly occur frequent failures due to corrosion of aluminum electrodes and wirings caused by its electrochemical action.

Referring next to the drawback (2), since resin encapsulation type semiconductors may sometimes be used under high temperature conditions, reliability must also be ensured even under such conditions. As an evaluation test for this purpose, there is generally practiced the acceleration test in which reliability is evaluated by application of a bias voltage at 80° C. to 150° C.

In such tests, among failures frequently occurring especially markedly in, for example, elements having MOS structures with semiconductor surfaces sensitive to outer charges or elements having PN junctions on which reverse bias has been applied, there is observed a phenomenon of increased leak current caused by channelling. This phenomenon may be considered to be generated by the electric field acting on the encapsulation resin layer contacted with the surface of the elements on which the voltage has been applied.

The resin encapsulation type semiconductor devices, having the above drawbacks, have been desired to be improved in such drawbacks.

An object of this invention is to provide a resin encapsulation type semiconductor device which overcomes such drawbacks and has excellent humidity resistance and high temperature electrical characteristics.

The present inventors have made extensive studies in order to achieve the above object and consequently found that a curing accelerator such as imidazole is the primary cause for forming the above drawbacks. And, by use of an epoxy resin composition shown below, it has been found that humidity resistance and high temperature electrical characteristics can be improved to accomplish this invention.

That is, the resin encapsultion type semiconductor device of this invention comprises a semiconductor element and a resinous encapsulator covering over said semiconductor element, said resinous encapsulator comprising a cured product of an epoxy resin composition comprising:

(a) a novolac type epoxy resin having an epoxy equivalent of 170 to 300;
(b) a novolac type phenol resin;
(c) an organic phosphine compound; and
(d) an organic phosphorus acid compound.

In the following, this invention is to be described in further detail.

The epoxy resin composition according to this invention comprises the following components as described below.

As the epoxy resin to be used in this invention, any kind of novolac type epoxy resin may be available, so long as it has an epoxy equivalent value of 170 to 300, including typically phenol novolac type epoxy resins, cresol novolac type epoxy resins, halo-containing phenol novolac type epoxy resins and the like. Such epoxy resins may be used either as a single species or a mixture of two or more species, or further as a mixture of these with other epoxy resins. As other epoxy resins, there may be included glycidyl ether type epoxy resins such as bisphenol A type epoxy resins; glycidyl ester type epoxy resins; glycidylamine type epoxy resins; linear aliphatic epoxy resins; alicyclic epoxy resins; heterocyclic epoxy resins; halo-containing epoxy resins; and so on. One kind or two kinds or more selected from these epoxy resins may be formulated at a proportion of 90% by weight or less, preferably 50% by weight or less based on the total amount of the epoxy resin. Also, the epoxy resin to be used in this invention desirably has a chlorine ion content of 10 ppm or less and a hydrolyzable chlorine of 0.1% by weight or less, because chlorine remaining in the resin is one of the causes for corrosive deterioration of aluminum electrodes and others.

As the novolac type phenol resins to be used as the curing agent in this invention, there may be included, for example, phenol novolac resins, cresol novolac resins, tert-butylphenol novolac resins, nonylphenol novolac resins, resorsin novolac resins and the like. One kind or two kinds or more selected from these resins may be used. Such a novolac type phenol resin may preferably have a softening point within the range from 60° to 120° C., when considering processability such as fluidity during molding. It is also desirable that such a novolac type phenol resin contains 3% by weight or less of a phenol resin component which is soluble in water at normal temperature, because phenol components with lower molecular weights may cause deterioration of resin characteristics.

The novolac type phenol resin may be formulated in an amount which is desired to be suitably selected in relation to the amount of the epoxy groups in the epoxy resin, preferably within the range from 0.5 to 1.5 in terms of the ratio of the number of phenolic hydroxyl groups in the phenol resin to the number of epoxy groups in the epoxy resin. At a ratio below 0.5 or in excess of 1.5 of phenolic hydroxyl groups/epoxy groups ratio, the reaction cannot sufficiently proceed, whereby the characteristics of the cured product will be lowered.

The organic phosphine compound to be used in this invention has the function as a curing accelerator, and improvements of humidity resistance and high temperature electrical characteristics can be brought about by incorporation of such a compound.

Such an organic phosphine compound is represented by the formula [I]:

[I]

wherein $R_1$, $R_2$ and $R_3$, either identical or different, represent hydrogen atoms, alkyl groups, aryl groups such as phenyl groups, tolyl groups, etc.; cycloalkyl groups such as cyclohexyl groups; or organic groups containing an organic phosphine represented by the formulas:

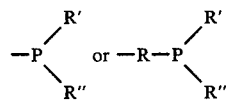

(where R is an alkane; R' and R'', either identical or different, are hydrogen atoms, alkyl groups, aryl groups such as phenyl groups, tolyl groups, etc. or cycloalkyl groups such as cyclohexyl groups, provided that the case where both R' and R'' are hydrogen atoms is excluded), provided that the case where all $R_1$, $R_2$ and $R_3$ are hydrogen atoms is excluded.

Examples of the compound [I]are tertiary phosphine compounds such as triphenylphosphine, tributylphosphine, tricyclohexylphosphine, methyldiphenylphosphine, etc.; secondary phosphine compounds such as butylphenylphosphine, diphenylphosphine, etc.; primary phosphine compounds such as phenylphosphine, octylphosphine, etc.; and tertiary bisphosphine compounds such as bisdiphenylphosphine, bis(diphenylphosphino)methane, 1,2-bis(diphenylphosphino)ethane, etc. One kind or two or more kinds selected from the group consisting of these compounds may be employed. Among them, there may preferably be employed arylphosphine compounds, above all most preferably triarylphosphines such as triphenylphosphine.

Such an organic phosphine compound may be incorporated in an amount of 0.001 to 20% by weight based on the total amount of the epoxy resin and the phenol resin, particularly preferably 0.01 to 5% by weight.

In this specification, the term "phosphorus acid compound" means all phosphorus acid compounds having oxygen atoms bonded directly to phosphorus atoms such as phosphoric acid, phosphorous acid, hypophosphorous acid, phosphonic acid, phosphinic acid, phosphinous acid and their derivatives.

As the organic phosphorus acid compound to be used in the present invention, there may be employed any of the organic phosphorus acid compounds having oxygen atoms bonded directly to phosphorus atoms in the molecules or having a part or all of said oxygen atoms substituted with one kind or two or more kinds of atoms selected from the group consisting of sulfur, selenium and tellurium, as exemplified by monophosphoric acid compounds such as organic phosphorus acids, organic phosphorus acid esters, organic phosphorus acid amides, organic phosphorus acid imides, organic phosphorus acid salts and the like or polyphosphorus acid compounds having two or more phosphorus atoms in one molecule. These organic phosphorus acid compounds are added with an aim to further improve humidity resistance and high temperature electrical characteristics of semiconductor devices through interaction with the organic phosphine compound, as compared with the case in which the organic phosphine compound is used alone.

Among the above organic phosphorus compounds, organic phosphorus acids have hydroxyl groups directly bonded to phosphorus atoms. Typical examples of such compounds are ethylphosphonic acid, phenylphosphonic acid, (4-ethylphenyl)phosphonic acid, cyclohexylphosphonic acid, methylenebisphosphonic acid, ethylidenebisphosphonic acid, dibutylphosphinic acid, diphenylphosphinic acid, butylphosphinous acid, phenylphosphinous acid, diethylphosphinous acid, diphenylphosphinous acid, and the like.

Organic phosphorus acid ester compounds have at least one hydrogen atom of the hydroxyl group directly bonded to a phosphorus atom substituted with an alkyl group, a cycloalkyl group, an aryl group, etc. These may include, for example, phosphoric acid triester compounds such as trimethyl phosphate, triethyl phosphate, tributyl phosphate, trioctyl phosphate, triphenyl phosphate, tricresyl phosphate, cresyldiphenyl phosphate, octyldiphenyl phosphate, trimethacryloxypropyl phosphate, triallyl phosphate, tripolyoxyethylenealkylether phosphate, and the like; phosphoric acid diester compounds such as dimethyl phosphate, dibutyl phosphate, dioctyl phosphate, diphenyl phosphate, dicresyl phosphate, octylphenyl phosphate, diacryloxyethyl phosphate, and the like; phosphoric acid monoester compounds such as ethyl phosphate, butyl phosphate, octyl phospahte, dodecyl phosphate, octadecyl phosphate, oleyl phosphate, phenyl phosphate, methacryloxypropyl phosphate and the like; phosphorous acid triester compounds such as triethyl phosphite, triisopropyl phosphite, trioleyl phosphite, triphenyl phosphite, tricresyl phosphite, tristearyl phosphite, allyldibutyl phosphite, and the like; phosphorous acid diester compounds such as diisopropyl phosphite, didodecyl phosphite, dioleyl phosphite, diphenyl phosphite, butylphenyl phosphite and the like; phosphorous acid monoester compounds such as butyl phosphite, oleyl phosphite, stearyl phosphite, phenyl phosphite and the like; hypophosphorous acid ester compounds such as dibutyl hypophosphite, diphenyl hypophosphite, octyl hypophosphite, phenyl hypophosphite and the like; phosphonic acid ester compounds such as dimethyl ethylphosphonate, diethyl phenylphosphonate, diphenyl phenylphosphonate, methyl phenylphosphonate, phenyl phenylphosphonate and the like; phosphinic acid ester compounds such as methyl diethylphosphinate, ethyl diphenylphosphinate, phenyl diphenylphosphinate, phenyl ethylphosphinate, phenyl phenylphosphinate and the like; phosphonous acid ester compounds such as diethyl butylphosphonate, dibutyl phenylphosphonate, diphenyl phenylphosphonate and the like; phosphinous acid ester compounds such as propyl diethylphosphinite, phenyl diphenylphosphinite, phenyl phenylphosphinite, ethyl butylphosphinite, butyl phenylphosphinite, octadecyl phosphinite, phenyl phosphinite and the like; and so on.

Phosphorus acid amide compounds have a part or all of the ester bonding sites of the above phosphorus acid ester compounds substituted with amide groups. These may include, for example, hexamethylphosphoric acid triamide, hexabutylphosphoric acid triamide, N''-cyclohexyl-N,N,N', N'-tetraethylphosphoric acid triamide, hexakis(2-hydroxyethyl)phosphoric acid amide, N,N',N'',N'''-tetraisopropylpyrolic acid amide, hexaethylphosphorous acid triamide, hexamethylphosphorous acid triamide, phenylphosphonous acid tetramethyldiamide, phenyl N,N'-diphenyldiamidophosphate, ethyl N,N'-dicyclohexyldiamidophosphate, N-dibutylamidophosphoric acid, N,N'-diphenyldiamidophosphoric acid, monobutyl N-diethylamidophosphate and the like.

Phosphorus acid imide compounds have imide groups in place of the amide groups at the amide bonding sites in the above phosphorus acid amide compounds, and these may include, for example, triethyl phenylimidophosphate, tributyl phenylimidophosphate and the like.

Organic phosphorus acid salt compounds are calcium salts, barium salts, aluminum salts, cobalt salts, iron salts, zinc salts, sodium salts, magnesium salts, ammonium salts and other salts of the aforesaid organic phosphorus acids, organic phosphorus acid ester compounds and the like, as exemplified by calcium phenylphosphonate, barium dodecylphosphonate, sodium dioctylphosphinate, etc.

The organic phosphorus compounds of this invention may be also inclusive of those in which the organic phosphorus acid compounds as described above have a part or all of the oxygen atoms bonded directly to phosphorus atoms substituted with one kind or two or more kinds of atoms selected from the group consisting of sulfur, selenium and tellurium. Such organic phosphorus acid compounds may include, for example, organic phosphorus acids such as phenylthiophosphonic acid, phenyldithiophosphonic acid, phenylselenophosphonic acid, butyltellunophosphonic acid, diphenylthiophosphinic acid, phenylthiophosphinous acid and the like; organic phosphorus acid esters such as tributyl thiophosphate, trioctyl thiophosphate, triphenyl thiophosphate, tricresyl thiophosphate, dioctyl thiophosphate, diphenyl thiophosphate, octadecyl thiophosphate, phenyl thiophosphate, trioleyl thiophosphite, triphenyl thiophosphite, didodecyl thiophosphite, diphenyl thiophosphite, oleyl thiophosphite, stearyl thiophosphite, diethyl phenylthiophosphonate, diphenyl phenylthiophosphonate, phenyl phenylthiophosphonate, diphenyl thiohypophosphite, phenyl diphenylthiophosphinate and the like; organic phosphorus acid amides such as hexamethylthiophosphoric acid triamide, hexaethylthiophosphorous acid triamide and the like.

Further, the organic phosphorus acid compounds of this invention may also be organic polyphosphorus acid compounds having two or more phosphorus atoms in one molecule. As such organic polyphosphorus acid compounds, there may be included the compounds represented by the following formula [II]:

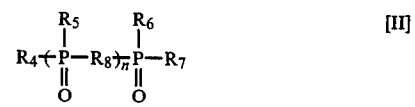

wherein $R_4$ through $R_7$, either identical or different, represent hydrogen atoms, hydroxyl groups, alkyl groups having 1 to 40 carbon atoms, aryl groyups such as phenyl groups, tolyl groups, and the like, cycloalkyl groups such as cyclohexyl groups and the like, phosphorus acid ester residues, phosphorus acid amide residues or phosphorus acid salt residues; $R_8$ represents an oxygen atom, an alkylene group having 1 to 40 carbon atoms, an arylene group such as a phenylene group, a tolylene group or the like, a cycloalkylene group such as cyclohexylene group or the like; each of $R_5$ and $R_8$ may be the same or different for respective units; and n is an integer of 1 or more; provided that at least one of $R_4$ to $R_8$ is an organic group, or the cyclic polyphosphorus acid compounds represented by the following formula [III]:

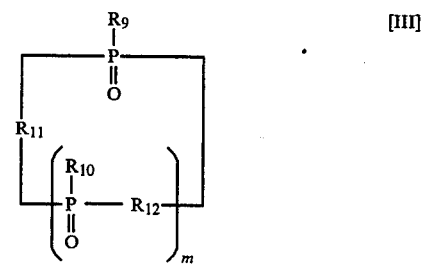

wherein $R_9$ and $R_{10}$, either identical or different, and $R_{10}$ may be the same or different for respective units, represent hydrogen atoms, hydroxyl groups, alkyl groups having 1 to 40 carbon atoms, aryl groyups such as phenyl groups, tolyl groups, and the like, cycloalkyl groups such as cyclohexyl groups and the like, phosphorus acid ester residues, phosphorus acid amide residues or phosphorus acid salt residues; $R_{11}$ and $R_{12}$, either identical or different, $R_{12}$ being either the same or different for respective units, represent oxygen atoms, alkyl groups having 1 to 40 carbon atoms, arylene groups such as phenylene groups, tolylene groups and the like or cycloalkylene groups such as cyclohexylene groups and the like; and m is an integer of 2 or more;

provided that at least one of $R_9$ to $R_{12}$ is an organic group.

As the organic phosphorus acid compound to be used in the present invention, there may be employed one kind or two or more kinds selected from the group consisting of the organic phosphorus acid compounds as described above.

Such an organic phosphorus acid compound may be incorporated preferably in an amount of 0.001 to 10 % by weight based on the total amount of the epoxy resin and the phenol resin.

The epoxy resin composition of this invention may also contain in addition to the above components inorganic fillers and various additives.

As the above inorganic fillers, there may be mentioned, for example, quartz glass powders, crystalline silica powders, glass fibers, talc, alumina powders, calcium silicate powders, calcium carbonate powders, barium sulfate powders, magnesia powders and so on, and one kind or two or more kinds selected from the group consisting of these may be employed. Among them, it is preferred to use quartz glass powders or crystalline silica powders, since they have high purities and low thermal expansion coefficients.

Such an inorganic filler may be incorporated in the composition in an amount, which is required to be suitably selected depending on the epoxy resin, the phenol resin and the inorganic filler employed. For example, when used for transfer molding, it is preferred to use a weight ratio of 1.5 to 4 relative to the total amount of the epoxy resin and the phenol resin. With regard to the particle size of the inorganic filler, fillers having any desired particle sizes may be suitably selected and by mixing in combination a filler with coarse particles and a filler with fine particles, moldability can be improved.

As various additives, there may be included, for example, mold release agents such as natural waxes, synthetic waxes, metallic salts of straight chain fatty acids, acid amides, esters, paraffins, etc.; flame retardants such as chlorinated paraffins, bromotoluene, hexabromobenzene, antimony trioxide, etc.; colorants such as carbon black, etc.; and silane coupling agents, which may be used in suitable formulations depending on the purposes.

Preparation of a molding material for encapsualtion of semiconductors from an epoxy resin composition having such a composition as described above may be conducted in a conventional manner, for example, by mixing sufficiently a starting material mixture with a predetermined formulation by means of a mixer, etc. and then applying a fusion mixing treatment on a hot roll, etc. or applying a mixing treatment by a kneader, etc., thereby obtaining easily a molding material comprising the epoxy resin composition.

For mixing of the epoxy resin composition according to this invention, respective weighed components may be mixed at the same time, or alternatively a part of the components may be previously mixed and the remainder of the components may be added to such a mixture. In the latter case, two or more kinds of the components may be mixed under powdery state or molten state under heating. In this invention, there may be employed a previously molten mixture of at least two compounds selected from the group consisting of an epoxy resin, a novolac type phenol resin, an organic phosphine compound and an organic phosphorus acid compound. When an organic phosphorus compound can only with difficulty be dispersed in an epoxy resin or a curing agent, or when an organic phosphorus acid is incorporated in a small amount, it is preferred to premix an organic phosphine compound with an organic phosphorus acid compound.

The resin encapsulation type semiconductor device of this invention can be prepared by encapsulating a semiconductor device such as IC, LSI, transistor, thyristor, diode and others, with the use of the molding material comprising the above epoxy resin composition. As such an encapsulation method, there may be employed a method generally adopted such as low pressure transfer molding, injection molding, compression molding, cast molding, etc. Among them, low pressure transfer molding is preferred. Further, it is also possible to employ a special encapsulation method such as the encapsulation method in which the semiconductor surface is coated with a solvent type or non-solvent type composition or the local encapsulation method as the so-called junction coating. In curing of the encapsulation resin, it is preferred to effect curing at a temperature of 150° C. or higher.

This invention is to be described in further detail by referring to the following Examples.

EXAMPLES 1-7

Various epoxy resin compositions (Examples 1-7) were prepared according to the formulations (parts by weight) as shown in Table 1 by using a cresol novolac type epoxy resin having an epoxy equivalent of 220 as the epoxy resin, a phenol novolac resin having a molecular weight of 800 as the curing agent, triphenylphosphine as an organic phosphine compound, phenylphosphonic acid, triphenyl phosphate, tristearyl phosphite, diphenyl phosphite, octadecyl phosphate calcium salt, tripolyoxyethylenealkylether phosphoric acid ester and triphenyl thiophosphate as the organic phosphorus acid compounds, and as other additives quartz glass powders (inorganic filler), antimony trioxide (flame retardant), carnauba wax (mold release agent), carbon black (colorant) and γ-glycidoxypropyltrimethoxy silane (silane coupling agent). At the same time, as Comparative examples, samples employing no organic phosphine compound or organic phosphorus acid compound, or employing an imidazole compound (2-methylimidazole) as curing accelerator were prepared (Comparative examples 1-5).

TABLE 1

| | Example | | | | | | | Comparative example | | | | |
|---|---|---|---|---|---|---|---|---|---|---|---|---|
| | 1 | 2 | 3 | 4 | 5 | 6 | 7 | 1 | 2 | 3 | 4 | 5 |
| Epoxy resin | 200 | 200 | 200 | 200 | 200 | 200 | 200 | 200 | 200 | 200 | 200 | 200 |
| Phenol resin | 93 | 103 | 84 | 93 | 103 | 84 | 93 | 103 | 93 | 93 | 93 | 93 |
| Triphenyl phosphine | 5 | 5 | 5 | 5 | 5 | 5 | 5 | 5 | — | — | — | — |
| Phenyl phosphonic acid | 2 | — | — | — | — | — | — | — | — | — | 2 | — |
| Triphenyl phosphate | — | 2 | — | — | — | — | — | — | 2 | — | — | — |
| Tristearyl phosphite | — | — | 2 | — | — | — | — | — | — | 2 | — | — |
| Diphenyl phosphite | — | — | — | 2 | — | — | — | — | — | — | — | — |
| Octadecyl phosphate | — | — | — | — | 2 | — | — | — | — | — | — | — |

TABLE 1-continued

| | Example | | | | | | | Comparative example | | | | |
|---|---|---|---|---|---|---|---|---|---|---|---|---|
| | 1 | 2 | 3 | 4 | 5 | 6 | 7 | 1 | 2 | 3 | 4 | 5 |
| calcium salt | | | | | | | | | | | | |
| Tripolyoxyethylene-alkylether phosphoric acid ester | — | — | — | — | — | 2 | — | — | — | — | — | — |
| Triphenyl thiophosphate | — | — | — | — | — | — | 2 | — | — | — | — | — |
| 2-Methylimidazol | — | — | — | — | — | — | — | — | 5 | — | — | 5 |
| Quarz glass powders | 700 | 700 | 700 | 700 | 700 | 700 | 700 | 700 | 700 | 700 | 700 | 700 |
| Antimony trioxide | 30 | 30 | 30 | 30 | 30 | 30 | 30 | 30 | 30 | 30 | 30 | 30 |
| Carunauba wax | 4 | 4 | 4 | 4 | 4 | 4 | 4 | 4 | 4 | 4 | 4 | 4 |
| Carbon black | 4 | 4 | 4 | 4 | 4 | 4 | 4 | 4 | 4 | 4 | 4 | 4 |
| γ-Glycidoxypropyl-trimethoxy silane | 4 | 4 | 4 | 4 | 4 | 4 | 4 | 4 | 4 | 4 | 4 | 4 |

Such epoxy resin compositions were mixed by means of a mixer, respectively, and then kneaded on a hot roll to obtain molding materials.

Using the thus prepared molding materials, transfer molding was carried out to resin encapsulated MOS type integrated circuits. Encapsulation was performed by molding a molding material (heated to 90° C. by a high frequency preheater) at 175° C. for 2 minutes, followed further by after-cure at 180° C. for 3 hours.

According to the above method, by using each of the epoxy resin compositions, 100 samples of resin encapsulation type semiconductor devices were prepared for each composition and tested as follows:

(1) Humidity resistance test (Bias PCT): By application of 10 V in a steam at 120° C., 2 atm., cumulative defective percentages (%) of defective samples in which failure of aluminum wiring occurred were examined with lapse of time;

(2) MOS-BT test: By applying a drain volage of 5 V and an off-set gate voltage of 5 V on the off-set gate MOS FET circuit in an oven at 100° C., the time at which the leak current value increased to 100 times the original value was deemed to be defective and cumulative defective percentages (%) of defective samples were examined with lapse of time.

The results of Bias PCT tests for examination of humidity resistance are shown in Table 2 and the results of MOS-BT tests for examination of high temperature electrical characteristics in Table 3, respectively.

Comparative examples 3 and 4 cannot be molded due to too slow curing rates.

TABLE 2

| | Bias PCT Cumulated defective percentage (%) | | | | |
|---|---|---|---|---|---|
| Time [hrs.] | 20 | 60 | 150 | 300 | 500 |
| Sample Example | | | | | |
| 1 | 0 | 0 | 0 | 0 | 0 |
| 2 | 0 | 0 | 0 | 0 | 0 |
| 3 | 0 | 0 | 0 | 0 | 0 |
| 4 | 0 | 0 | 0 | 0 | 0 |
| 5 | 0 | 0 | 0 | 0 | 0 |
| 6 | 0 | 0 | 0 | 0 | 0 |
| 7 | 0 | 0 | 0 | 0 | 0 |
| Comparative example | | | | | |
| 1 | 0 | 0 | 0 | 44 | 100 |
| 2 | 32 | 100 | — | — | — |
| 5 | 76 | 100 | — | — | — |

TABLE 3

| | MOS-BT test Cumulated defective percentage (%) | | | | |
|---|---|---|---|---|---|
| Time [min.] | 10 | 50 | 100 | 1000 | 2000 |
| Sample Example | | | | | |
| 1 | 0 | 0 | 0 | 0 | 0 |
| 2 | 0 | 0 | 0 | 0 | 0 |
| 3 | 0 | 0 | 0 | 0 | 0 |
| 4 | 0 | 0 | 0 | 0 | 0 |
| 5 | 0 | 0 | 0 | 0 | 0 |
| 6 | 0 | 0 | 0 | 0 | 0 |
| 7 | 0 | 0 | 0 | 0 | 0 |
| Comparative example | | | | | |
| 1 | 0 | 0 | 0 | 52 | 100 |
| 2 | 43 | 100 | — | — | — |
| 5 | 81 | 100 | — | — | — |

EXAMPLES 8-15

Various epoxy resin compositions (Examples 8-15) were prepared according to the formulations (parts by weight) as shown in Table 4 by using the same starting materials as in Examples 1-7 except that by using, as an organic phosphorus acid compound, diphenyl hypophosphite, phenyl phenylphosphinate, hexamethylphosphoric triamide, triethyl phenylimidophosphate, phenyl selenophosphonate, phenyl tellunophosphonate,

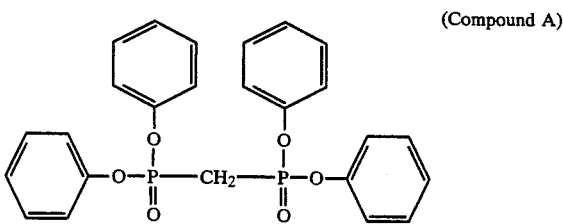
(Compound A)

and (Compound B)

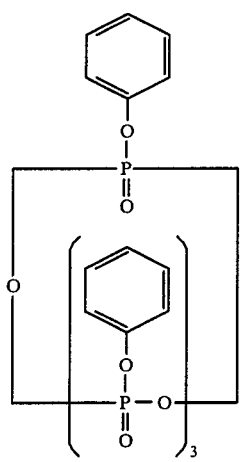

At the same time, as Comparative examples, samples employing no organic phosphine compound and employing an imidazole compound (2-phenylimidazole) as curing accelerator were prepared (Comparative examples 6-7).

TABLE 4

|  | Example |  |  |  |  |  |  |  | Comparative example |  |
|---|---|---|---|---|---|---|---|---|---|---|
|  | 8 | 9 | 10 | 11 | 12 | 13 | 14 | 15 | 6 | 7 |
| Epoxy resin | 200 | 200 | 200 | 200 | 200 | 200 | 200 | 200 | 200 | 200 |
| Phenol resin | 93 | 84 | 93 | 84 | 93 | 84 | 93 | 84 | 93 | 84 |
| Triphenyl phosphine | 5 | 5 | 5 | 5 | 5 | 5 | 5 | 5 | — | — |
| Diphenyl hypophosphite | 2 | — | — | — | — | — | — | — | — | — |
| Phenyl phenylphosphinate | — | 2 | — | — | — | — | — | — | — | — |
| Hexamethylphosphoric triamide | — | — | 1 | — | — | — | — | — | 1 | — |
| Triethyl phenylimidophosphate | — | — | — | 1 | — | — | — | — | — | — |
| Phenyl selenophosphonate | — | — | — | — | 1 | — | — | — | — | — |
| Phenyl tellunophosphonate | — | — | — | — | — | 1 | — | — | — | — |
| Compound A | — | — | — | — | — | — | 2 | — | — | 2 |
| Compound B | — | — | — | — | — | — | — | 2 | — | — |
| 2-Phenylimidazol | — | — | — | — | — | — | — | — | 5 | 5 |
| Quarz glass powders | 700 | 700 | 700 | 700 | 700 | 700 | 700 | 700 | 700 | 700 |
| Carunauba wax | 4 | 4 | 4 | 4 | 4 | 4 | 4 | 4 | 4 | 4 |
| Carbon black | 4 | 4 | 4 | 4 | 4 | 4 | 4 | 4 | 4 | 4 |
| γ-Glycidoxypropyl-trimethoxy silane | 4 | 4 | 4 | 4 | 4 | 4 | 4 | 4 | 4 | 4 |

Using the epoxy resin compositions shown in Table 4, resin encapsulation type semiconductor devices were prepared as the same procedures as in Examples 1-7.

Each 100 samples of resin encapsulation type semiconductor devices were tested as the same manner as in Examples 1-7.

The results of Bias PCT tests are shown in Table 5 and the results of MOS-BT tests in Table 6, respectively.

TABLE 5

|  | Bias PCT Cumulated defective percentage (%) |  |  |  |  |
|---|---|---|---|---|---|
| Time [hrs.] | 20 | 60 | 150 | 300 | 500 |
| Sample Example |  |  |  |  |  |
| 8 | 0 | 0 | 0 | 0 | 1 |
| 9 | 0 | 0 | 0 | 0 | 2 |
| 10 | 0 | 0 | 0 | 12 | 38 |
| 11 | 0 | 0 | 0 | 4 | 21 |
| 12 | 0 | 0 | 0 | 0 | 5 |
| 13 | 0 | 0 | 0 | 0 | 8 |
| 14 | 0 | 0 | 0 | 0 | 0 |
| 15 | 0 | 0 | 0 | 0 | 1 |
| Comparative example |  |  |  |  |  |
| 6 | 65 | 100 | — | — | — |
| 7 | 42 | 100 | — | — | — |

TABLE 6

|  | MOS-BT test Cumulated defective percentage (%) |  |  |  |  |
|---|---|---|---|---|---|
| Time [min.] | 10 | 50 | 100 | 1000 | 2000 |
| Sample Example |  |  |  |  |  |
| 8 | 0 | 0 | 0 | 0 | 2 |
| 9 | 0 | 0 | 0 | 0 | 3 |
| 10 | 0 | 0 | 0 | 22 | 47 |
| 11 | 0 | 0 | 0 | 13 | 24 |
| 12 | 0 | 0 | 0 | 0 | 9 |
| 13 | 0 | 0 | 0 | 0 | 11 |
| 14 | 0 | 0 | 0 | 0 | 0 |
| 15 | 0 | 0 | 0 | 0 | 1 |
| Comparative example |  |  |  |  |  |
| 6 | 68 | 100 | — | — | — |
| 7 | 56 | 100 | — | — | — |

EXAMPLES 16-20

Various epoxy resin compositions (Examples 16-20) were prepared according to the formulations (parts by weight) as shown in Table 7 by using the same starting materials as in Examples 1-7 except that by using tricresyl phosphate, diphenyl phenylphosphonate, butyl phenylphosphinite and triphenyl thiophosphate as an organic phosphorus acid compound.

At the same time, as Comparative examples, samples employing no organic phosphine compound and employing an imidazole compound (2-phenylimidazole) as curing accelerator were prepared (Comparative examples 8-9).

Using the epoxy resin compositions shown in Table 7, resin encapsulation type semiconductor devices were prepared as the same manner as in Examples 1-7 except that by using the previously molten mixture of triphenyl phosphine and tricresyl phosphate in Example 16, of epoxy resin and tricresyl phosphate, and of phenol resin and triphenyl phosphine in Example 17, of phenol resin and diphenyl phenylphosphonate in Example 18 and in Comparative example 8, of phenol resin, triphenyl phosphine and butyl phenylphosphinite in Example 19, and of phenol resin and triphenyl thiophosphate in Example 20 and in Comparative example 9.

Each 100 samples of resin encapsulation type semiconductor devices were tested as the same manner as in Examples 1-7.

The results of Bias PCT tests are shown in Table 8 and the results of MOS-BT tests in Table 9, respectively.

TABLE 7

|  | Example | | | | | Comparative example | |
|---|---|---|---|---|---|---|---|
|  | 16 | 17 | 18 | 19 | 20 | 8 | 9 |
| Epoxy resin | 200 | 200 | 200 | 200 | 200 | 200 | 200 |
| Phenol resin | 93 | 90 | 85 | 82 | 90 | 85 | 90 |
| Triphenyl phosphine | 5 | 5 | 5 | 5 | 5 | — | — |
| Tricresyl phosphate | 2 | 2 | — | — | — | — | — |
| Diphenyl phenyl-phosphonate | — | — | 2 | — | — | 2 | — |
| Butyl phenyl-phosphinite | — | — | — | 2 | — | — | — |
| Triphenyl thiophosphate | — | — | — | — | 2 | — | 2 |
| 2-Phenylimidazol | — | — | — | — | — | 5 | 5 |
| Quarz glass powders | 750 | 750 | 750 | 750 | 750 | 750 | 750 |
| Carunauba wax | 4 | 4 | 4 | 4 | 4 | 4 | 4 |
| Carbon black | 4 | 4 | 4 | 4 | 4 | 4 | 4 |
| γ-Glycidoxypropyl-trimethoxy silane | 4 | 4 | 4 | 4 | 4 | 4 | 4 |

TABLE 8

|  | Bias PCT Cumulated defective percentage (%) | | | | |
|---|---|---|---|---|---|
| Time [hrs.] | 20 | 60 | 150 | 300 | 500 |
| Sample Example |  |  |  |  |  |
| 16 | 0 | 0 | 0 | 0 | 0 |
| 17 | 0 | 0 | 0 | 0 | 0 |
| 18 | 0 | 0 | 0 | 0 | 0 |
| 19 | 0 | 0 | 0 | 0 | 0 |
| 20 | 0 | 0 | 0 | 0 | 0 |
| Comparative example |  |  |  |  |  |
| 8 | 34 | 100 | — | — | — |
| 9 | 42 | 100 | — | — | — |

TABLE 9

|  | MOS-BT test Cumulated defective percentage (%) | | | | |
|---|---|---|---|---|---|
| Time [min.] | 10 | 50 | 100 | 1000 | 2000 |
| Sample Example |  |  |  |  |  |
| 16 | 0 | 0 | 0 | 0 | 0 |
| 17 | 0 | 0 | 0 | 0 | 0 |
| 18 | 0 | 0 | 0 | 0 | 0 |
| 19 | 0 | 0 | 0 | 0 | 0 |
| 20 | 0 | 0 | 0 | 0 | 0 |
| Comparative example |  |  |  |  |  |
| 8 | 47 | 100 | — | — | — |

TABLE 9-continued

|  | MOS-BT test Cumulated defective percentage (%) | | | | |
|---|---|---|---|---|---|
| Time [min.] | 10 | 50 | 100 | 1000 | 2000 |
| 9 | 56 | 100 | — | — | — |

EXAMPLES 21

An epoxy resin composition (Example 21) was prepared according to the formulations (parts by weight) as shown in Table 10 by using the same starting materials as in Examples 1-7 except that by using triphenyl phosphite as an organic phosphorus acid compound.

At the same time, as Comparative example, sample employing no organic phosphine compound and organic phosphorus acid compound and employing a borate compound (tetraphenyl phosphonium tetraphenylborate) as curing accelerator was prepared (Comparative example 10).

Such epoxy resin compositions were kneaded on a roll to obtain molding materials as in Examples 1-7. Using the thus prepared molding materials, transfer molding was carried out to resin encapsulated MOS type integrated circuits. Encapsulation was perforemed by molding a molding material at 175° C. for 1 minute in Example 21. However, the epoxy resin composition in Comparative example 10 was needed encapsulation time for 12 minutes since the curing rate thereof was late. The cured resin encapsulation type semiconductor devices were then aftercured at 175° C. for 8 hours.

Each 100 samples of resin encapsulation type semiconductor devices were tested as the same manner as in Examples 1-7.

The results of Bias PCT tests are shown in Table 11 and the results of MOS-BT tests in Table 12, respectively.

TABLE 10

|  | Example 21 | Comparative example 10 |
|---|---|---|
| Epoxy resin | 200 | 200 |
| Phenol resin | 93 | 93 |
| Triphenyl phosphine | 5 | — |
| Tetraphenyl phosphonium tetraphenylborate | — | 5 |
| Triphenyl phosphite | 2 | — |
| Quarz glass powders | 700 | 700 |
| Carunauba wax | 4 | 4 |
| Carbon black | 4 | 4 |
| Glycidoxypropyl-trimethoxy silane | 4 | 4 |

TABLE 11

|  | Bias PCT Cumulated defective percentage (%) | | | | |
|---|---|---|---|---|---|
| Time [hrs.] | 50 | 100 | 150 | 300 | 500 |
| Sample Example 21 | 0 | 0 | 0 | 0 | 0 |
| Comparative example 10 | 0 | 3 | 49 | 100 | — |

TABLE 12

|  | MOS-BT test Cumulated defective percentage (%) | | | | |
|---|---|---|---|---|---|
| Time [min.] | 50 | 100 | 500 | 1000 | 2000 |
| Sample Example 21 | 0 | 0 | 0 | 0 | 0 |

TABLE 12-continued

| | | MOS-BT test Cumulated defective percentage (%) | | | | |
|---|---|---|---|---|---|---|
| | Time [min.] | 50 | 100 | 500 | 1000 | 2000 |
| Comparative example 10 | | 0 | 1 | 24 | 100 | — |

As apparently seen from the above Tables, the resin encapsualtion type semiconductor devices encapsulated by use of the epoxy resin compositions according to this invention are greatly reduced in corrosion of aluminum wirings and others, without lowering in functions of the semiconductor elements due to increased leak current, thus indicating very excellent humidity resistance and high temperature electrical characteristics.

We claim:

1. A resin encapsulation type semiconductor device provided with a semiconductor element and a resinous encapsulator covering over said semiconductor element, said resinous encapsulator comprising a cured product epoxy resin composition comprising:
   (a) a novolac type epoxy resin having an epoxy equivalent of 170 to 300;
   (b) a novolac type phenol resin;
   (c) an organic phosphine compound; and
   (d) an organic phosphorus acid compound in an amount of 0.001 to 10% by weight based on the total amount of the epoxy resin and the phenol resin.

2. A resin encapsulation type semiconductor device according to claim 1, wherein said novolac type phenol resin is formulated in an amount which is selected in relation to the amount of the epoxy resin, within the range from 0.5 to 1.5 in terms of the ratio of the number of phenolic hydroxyl groups in the phenol resin to the number of epoxy groups in the epoxy resin.

3. A resin encapsulation type semiconductor device according to claim 1, wherein said organic phosphine compound is triphenyl phosphine.

4. A resin encapsulation type semiconductor device according to claim 1, wherein said organic phosphorus acid compound is one kind or two or more kinds selected from the group consisting of organic phosphoric acid compound, organic phosphorous acid compound, organic hypophosphorous acid compound, organic phosphonic acid compound, organic phosphinic acid compound and organic phosphinous acid compound.

5. A resin encapsulation type semiconductor device according to claim 1, wherein said organic phosphorus acid compound is one kind or two or more kinds selected from the group consisting of organic phosphorus acids, organic phosphorus acid esters, organic phosphorus acid amides, organic phosphorus acid imides and organic phosphorus acid salts.

6. A resin encapsulation type semiconductor device according to claim 5, wherein said organic phosphorus acid compound is an organic phosphorus acid ester.

7. A resin encapsulation type semiconductor device according to claim 1, wherein said organic phosphorus acid compound has oxygen atoms directly bonded to phosphorus atoms.

8. A resin encapsulation type semiconductor device according to claim 7, wherein said organic phosphorus acid compound has a part or all of the oxygen atoms substituted with one kind or two or more kinds of atoms selected from the group consisting of sulfur, selenium and tellurium.

9. A resin encapsulation type semiconductor device according to claim 1, wherein said organic phosphine compound is incorporated in an amount of 0.001 to 20% by weight based on the total amount of the epoxy resin and the phenol resin.

10. A resin encapsulation type semiconductor device according to claim 1, wherein there is employed a mixture of at least two components selected from the group consisting of the epoxy resin, the novolac type phenol resin, the organic phosphine compound and the organic phosphorus compound prepared previously by powder mixing or fusion mixing.

11. A resin encapsulation type semiconductor device according to claim 1, wherein said epoxy resin composition further contains an inorganic filler.

12. A resin encapsulation type semiconductor device according to claim 1, wherein said organic phosphorus acid compound is trycresyl phosphate.

13. A resin encapsulation type semiconductor device according to claim 1, wherein said organic phosphorus acid compound is cresyl diphenylphosphate.

* * * * *